United States Patent
Moon et al.

(10) Patent No.: US 9,559,257 B2
(45) Date of Patent: *Jan. 31, 2017

(54) LIGHT EMITTING DEVICE AND LIGHTING SYSTEM

(71) Applicant: LG INNOTEK CO., LTD., Seoul (KR)

(72) Inventors: Yong Tae Moon, Seoul (KR); Hyun Chul Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/334,559

(22) Filed: Jul. 17, 2014

(65) Prior Publication Data

US 2015/0021545 A1 Jan. 22, 2015

(30) Foreign Application Priority Data

Jul. 18, 2013 (KR) ........................ 10-2013-0084735

(51) Int. Cl.
*H01L 33/14* (2010.01)
*H01L 33/06* (2010.01)
*H01L 33/32* (2010.01)

(52) U.S. Cl.
CPC ............. *H01L 33/145* (2013.01); *H01L 33/06* (2013.01); *H01L 33/32* (2013.01)

(58) Field of Classification Search
CPC .......... H01L 33/02; H01L 33/06; H01L 33/14; H01L 33/145; H01L 33/16; H01L 33/18; H01L 33/32
See application file for complete search history.

(56) References Cited

U.S. PATENT DOCUMENTS

| 5,937,274 A | * | 8/1999 | Kondow ............... B82Y 20/00 257/186 |
| 7,095,051 B2 | | 8/2006 | Nagahama et al. |

(Continued)

FOREIGN PATENT DOCUMENTS

| DE | 10 2009 015 569 A1 | 10/2010 | |
| DE | 10 2009 0155 69 | * 10/2010 | ............. H01L 33/00 |

(Continued)

OTHER PUBLICATIONS

Machine translation, Nagahama, Japanese Patent No. 4,291,960 B2, translation date: Sep. 15, 2015, Espacenet, all pages.*

(Continued)

*Primary Examiner* — Victoria K Hall
(74) *Attorney, Agent, or Firm* — Ked & Associates, LLP

(57) ABSTRACT

A light emitting device may include a first conductive type semiconductor layer, an active layer including a quantum well and a quantum wall on the first conductive type semiconductor layer, an undoped last barrier layer on the active layer; an $Al_xIn_yGa_{(1-x-y)}N$ ($0 \le x \le 1$, $0 \le y \le 1$)-based layer on the undoped last barrier layer; and a second conductive type semiconductor layer on the $Al_xIn_yGa_{(1-x-y)}N$-based layer. The undoped last barrier layer may be provided between the $Al_xIn_yGa_{(1-x-y)}N$ ($0 \le x \le 1$, $0 \le y \le 1$)-based layer and a last quantum well which is closest to the second conductive type semiconductor layer among the quantum well and may include a first $In_{p1}Ga_{1-p1}N$ ($0<p1<1$) layer, an $Al_{q1}In_{q2}Ga_{1-q1-q2}N$ ($0<q1$, $q2<1$) layer on the first $In_{p1}Ga_{1-p1}N$ layer, and a second $In_{p2}Ga_{1-p2}N$ ($0<p2<1$) layer on the $Al_{q1}In_{q2}Ga_{1-q1-q2}N$ layer.

16 Claims, 8 Drawing Sheets

(56) References Cited

U.S. PATENT DOCUMENTS

| | | | | |
|---|---|---|---|---|
| 7,884,350 B2* | 2/2011 | Kim | ................. | H01L 33/12 257/13 |
| 7,977,665 B2* | 7/2011 | Moon | ................. | B82Y 20/00 257/14 |
| 8,110,841 B2* | 2/2012 | Shin | ................. | H01L 33/32 257/103 |
| 8,426,844 B2* | 4/2013 | Moon | ................. | H01L 33/04 257/14 |
| 8,648,384 B2* | 2/2014 | Na | ................. | H01L 33/06 257/101 |
| 8,742,439 B2* | 6/2014 | Shin | ................. | H01L 33/06 257/97 |
| 8,908,733 B2* | 12/2014 | Avramescu | ................. | B82Y 20/00 257/14 |
| 9,087,961 B2* | 7/2015 | Moon | ................. | H01L 33/32 |
| 9,130,121 B2* | 9/2015 | Kozaki | ................. | B82Y 20/00 |
| 9,166,100 B2* | 10/2015 | Han | ................. | H01L 33/06 |
| 9,209,361 B2* | 12/2015 | Ueta | ................. | H01L 33/16 |
| 9,236,531 B2* | 1/2016 | Choi | ................. | H01L 33/32 |
| 2002/0190259 A1* | 12/2002 | Goetz | ................. | C30B 25/02 257/79 |
| 2003/0020061 A1* | 1/2003 | Emerson | ................. | H01L 33/007 257/14 |
| 2003/0136957 A1* | 7/2003 | Tsuda | ................. | B82Y 20/00 257/14 |
| 2003/0136970 A1* | 7/2003 | Takeya | ................. | B82Y 20/00 257/90 |
| 2003/0197188 A1* | 10/2003 | Watatani | ................. | B82Y 20/00 257/88 |
| 2005/0127391 A1* | 6/2005 | Yanamoto | ................. | B82Y 20/00 257/103 |
| 2006/0124918 A1* | 6/2006 | Miller | ................. | B82Y 20/00 257/14 |
| 2006/0133440 A1* | 6/2006 | Kim | ................. | B82Y 20/00 372/45.01 |
| 2007/0272936 A1* | 11/2007 | Shin | ................. | H01L 33/06 257/97 |
| 2008/0023688 A1* | 1/2008 | Johnson | ................. | H01L 29/201 257/13 |
| 2008/0247435 A1* | 10/2008 | Choi | ................. | B82Y 20/00 372/46.01 |
| 2008/0298414 A1* | 12/2008 | Choi | ................. | H01S 5/22 372/45.012 |
| 2008/0308787 A1* | 12/2008 | Lee | ................. | H01L 33/32 257/13 |
| 2009/0045392 A1* | 2/2009 | Park | ................. | B82Y 20/00 257/13 |
| 2009/0152586 A1* | 6/2009 | Lee | ................. | H01L 33/32 257/103 |
| 2010/0008393 A1* | 1/2010 | Enya | ................. | H01L 33/32 372/46.01 |
| 2010/0019256 A1* | 1/2010 | Wu | ................. | H01L 33/04 257/94 |
| 2010/0032008 A1* | 2/2010 | Adekore | ................. | B82Y 20/00 136/255 |
| 2010/0032649 A1* | 2/2010 | Lin | ................. | H01L 33/04 257/13 |
| 2010/0046205 A1* | 2/2010 | Chu | ................. | H01L 33/06 362/97.1 |
| 2010/0304553 A1* | 12/2010 | Yokoyama | ................. | B82Y 10/00 438/478 |
| 2011/0024721 A1* | 2/2011 | Edamura | ................. | B82Y 20/00 257/13 |
| 2011/0138341 A1* | 6/2011 | Shatalov | ................. | B82Y 20/00 716/30 |
| 2011/0284821 A1* | 11/2011 | Moon | ................. | B82Y 20/00 257/13 |
| 2012/0104356 A1* | 5/2012 | Han | ................. | H01L 33/06 257/13 |
| 2013/0056785 A1 | 3/2013 | Hwang | | |
| 2015/0090955 A1* | 4/2015 | Park | ................. | H01L 33/0025 257/13 |
| 2015/0287876 A1* | 10/2015 | Han | ................. | H01L 33/06 257/13 |
| 2015/0295126 A1* | 10/2015 | Suga | ................. | G01B 9/02091 356/479 |

FOREIGN PATENT DOCUMENTS

| | | | | |
|---|---|---|---|---|
| EP | 1 385 241 A1 | | 1/2004 | |
| EP | 1385241 | * | 1/2004 | ............ H01S 5/343 |
| EP | 2 568 503 A2 | | 3/2013 | |
| EP | 2568503 | * | 3/2013 | ............ H01L 27/15 |
| JP | 4291960 B2 | * | 4/2009 | ............ H01S 5/343 |
| KR | 10-1071755 | * | 10/2011 | ............ H01L 33/06 |

OTHER PUBLICATIONS

European Search Report dated Dec. 3, 2014 issued in Application No. 14 177 401.8.
In Application No. 14177401.8.

* cited by examiner

LIGHT EMITTING DEVICE AND LIGHTING SYSTEM

CROSS-REFERENCE TO RELATED APPLICATIONS

This application claims priority under 35 U.S.C. §119 to Korean Patent Application No. 10-2013-0084735, filed on Jul. 18, 2013, whose entire disclosure is hereby incorporated by reference.

BACKGROUND

1. Field

The embodiment relates to a light emitting device, a method of manufacturing a light emitting device, a light emitting device package, and a lighting system.

2. Background

A light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When a forward voltage is applied to an LED, electrons of an n layer are combined with holes of a p layer, so that energy corresponding to an energy gap between a conduction band and a valence band may be released. This energy is mainly realized as heat or light, and the LED emits the energy as light.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

Recently, as the demand for the high-efficiency LED has been increased, improvement of the intensity of light has been sought after. In order to improve the intensity of light, various attempts, such as improvement of a multi-quantum well (MQW) of an active layer, improvement of an electron blocking layer and improvement of a layer below the active layer, have been performed, but the great effect is not achieved.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
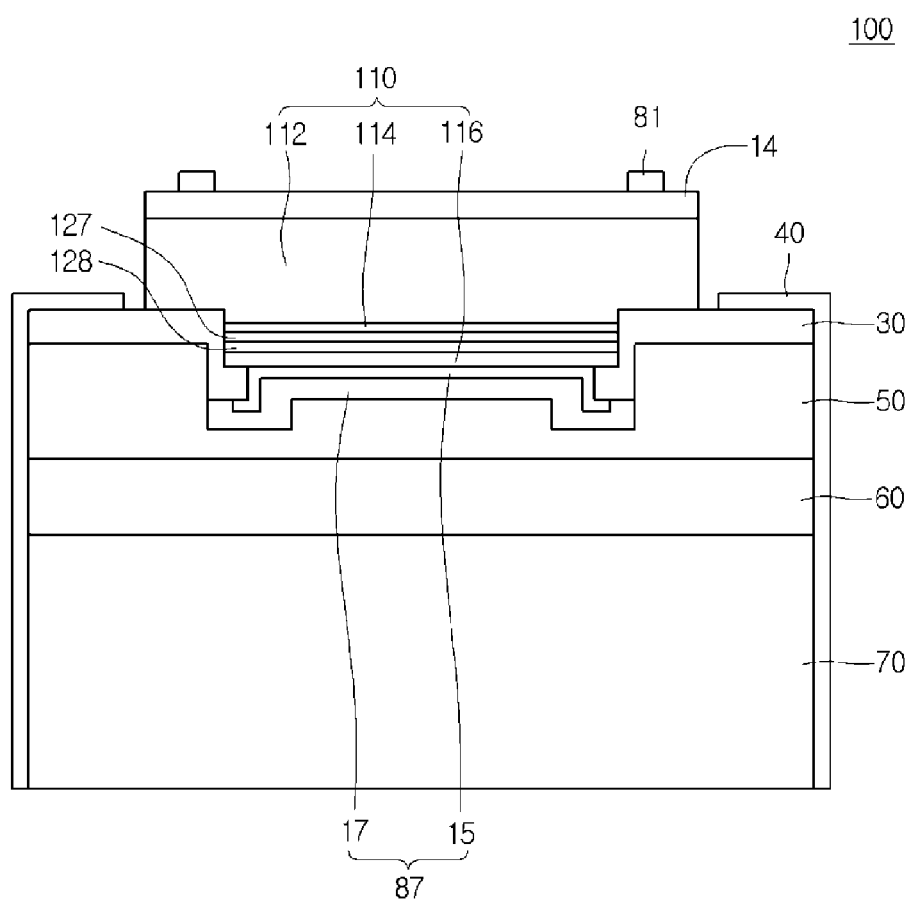
FIG. 1 is a sectional view showing a light emitting device according to the embodiment.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

According to the related art ('related art' may include technologies which are not well-known in the art upon the filing date of the present application), the light emitting device includes an N type semiconductor layer and a P type semiconductor layer, which may serve as a basic light emitting structure, and includes an electron blocking layer between the active layer and the P type semiconductor layer, so that electrons having high mobility are blocked, thereby improving the light emitting efficiency.

In addition, according to the related art, a last barrier is provided between a last quantum well and an electron blocking layer so that an quantum confinement effect may be provided to the last quantum well and perform a function of protecting the active layer, by which an Mg dopant of the electron blocking layer is prevented from moving into the quantum well of the active layer.

Meanwhile, according to the related art, the last barrier includes last GaN and InGaN barriers, and the following problems exist. For example, because of the last GaN barrier, the internal field of the quantum well is increased by the stress caused due to the lattice mismatch between the InGaN quantum well adjacent to the P type semiconductor and the last GaN barrier, so that the light emitting effect of the quantum well is deteriorated.

To the contrary, because of the last InGaN barrier, although the lattice mismatch between the InGaN quantum well adjacent to the P type semiconductor and the last InGaN barrier is reduced when compared with that of the last GaN barrier, the energy band gap of the last InGaN barrier is less than that of the last GaN barrier, so that the quantum confinement effect of electrons in the quantum well is reduced.

Therefore, because of the last barrier of the related art, the light emitting efficiency of the structure (last GaN barrier) having a superior quantum confinement effect may deteriorate due to the stress caused by the lattice mismatch, and the quantum confinement effect of the structure having a reduced lattice mismatch (last InGaN barrier) may be reduced so that the current injection efficiency of a device may deteriorate.

To solve these issues, it is requested to develop a light emitting device capable of effectively increasing the quantum confinement effect while minimizing the stress applied to the quantum well.

Figure 2:
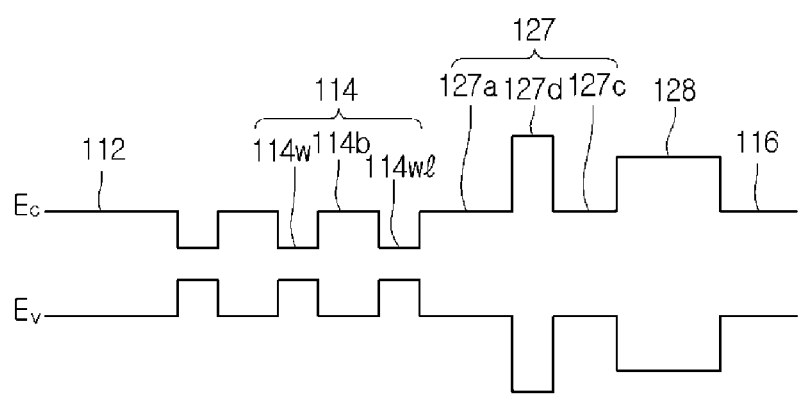
FIG. 2 is a view illustrating an example of an energy band diagram of a light emitting device according to the embodiment.
Figure 3:
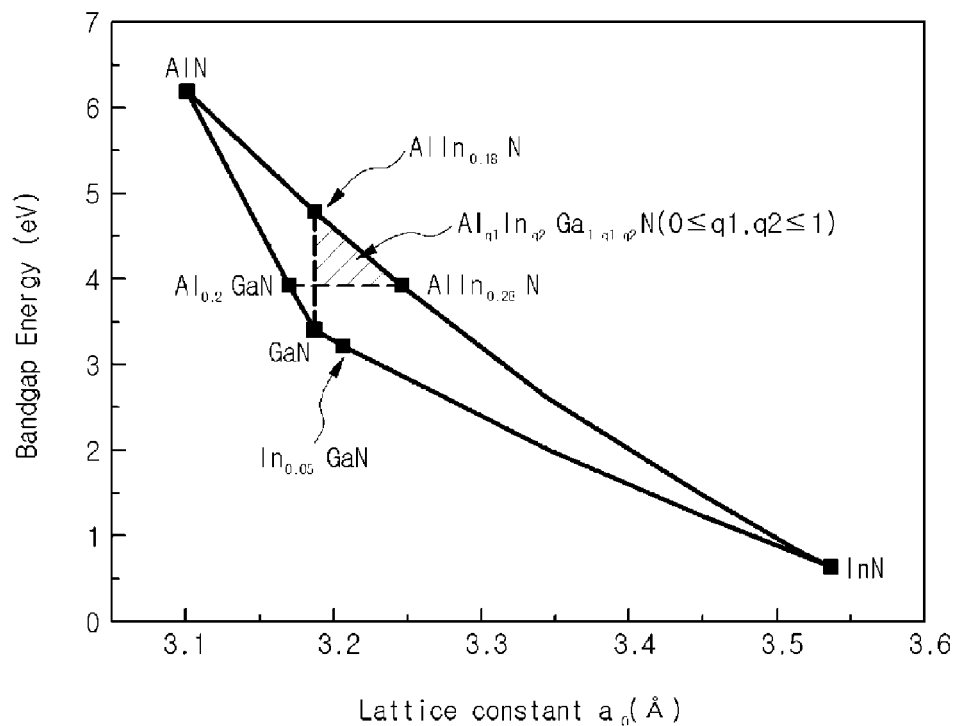
FIG. 3 is a graph illustrating relation between bandgap energy, a plane-directional lattice constant and a compound of a light emitting device according to the embodiment.

FIG. 1 is a sectional view showing a light emitting device according to the embodiment. In addition, FIG. 2 is a view illustrating an example of an energy band diagram of a light emitting device according to the embodiment. FIG. 3 is a graph illustrating relation between bandgap energy, a plane-directional lattice constant and a compound of a light emitting device according to the embodiment.

Referring to FIG. 2, a light emitting device 100 according to the embodiment may include a first conductive type semiconductor layer 112, an active layer 114 including a quantum well 114w and a quantum wall 114b on the first conductive type semiconductor layer 112, an undoped last barrier layer 127 on the active layer 114, an $Al_xIn_yGa_{(1-x-y)}N$ ($0 \leq x \leq 1$, $0 \leq y \leq 1$)-based layer 128 on the undoped last barrier layer 127, and a second conductive type semiconductor layer 116 on the $Al_xIn_yGa_{(1-x-y)}N$ ($0 \leq x \leq 1$, $0 \leq y \leq 1$)-based layer 128. The $Al_xIn_yGa_{(1-x-y)}N$ ($0 \leq x \leq 1$, $0 \leq y \leq 1$)-based layer 128 may serve as an electron blocking layer.

According to the embodiment, the undoped last barrier layer 127 may include a first $In_{p1}Ga_{1-p1}N$ ($0 < p1 < 1$) layer 127a, an $Al_{q1}In_{q2}Ga_{1-q1-q2}N$ ($0 < q1$, $q2 < 1$) layer 127d on the first $In_{p1}Ga_{1-p1}N$ layer 127a, and a second $In_{p2}Ga_{1-p2}N$ ($0 < p2 < 1$) layer 127c on the $Al_{q1}In_{q2}Ga_{1-q1-q2}N$ layer 127d.

According to the embodiment, the undoped last barrier layer 127 having the structure described above is provided so that a quantum confinement effect, light emitting efficiency, and device reliability may be improved as described below.

Referring to FIG. 3, a plane-directional lattice constant of the $Al_{q1}In_{q2}Ga_{1-q1-q2}N$ layer 127d may be equal to or greater than that of the quantum wall 114b. For example, when the quantum wall 114b is a GaN quantum wall, the plane-directional lattice constant of the $Al_{q1}In_{q2}Ga_{1-q1-q2}N$ layer may be equal to or greater than that of the GaN quantum wall 114b.

Further, according to the embodiment, the plane-directional lattice constant of the $Al_{q1}In_{q2}Ga_{1-q1-q2}N$ layer 127d may be different from that of the plane-directional lattice constant of the quantum wall 114b. For example, the plane-directional lattice constant of the $Al_{q1}In_{q2}Ga_{1-q1-q2}N$ layer 127d may exceed that of the quantum wall 114b, but the embodiment is not limited thereto.

In addition, according to the embodiment, the concentration q2 of In in the $Al_{q1}In_{q2}Ga_{1-q1-q2}N$ layer 127d is controlled in the range of $0.16 \leq q2 \leq 0.2$ and the plane-directional lattice constant of the $Al_{q1}In_{q2}Ga_{1-q1-q2}N$ layer 127d is controlled to be equal to or greater than that of the quantum wall 114b.

The plane-directional lattice constants of the first $In_{p1}Ga_{1-p1}N$ layer 127a and the second $In_{p2}Ga_{1-p2}N$ layer 127c may be equal to or greater than that of the quantum wall 114b. In addition, the plane-directional lattice constants of the first $In_{p1}Ga_{1-p1}N$ layer 127a and the second $In_{p2}Ga_{1-p2}N$ layer 127c may be different from that of the quantum wall 114b. For example, the plane-directional lattice constants of the first $In_{p1}Ga_{1-p1}N$ layer 127a and the second $In_{p2}Ga_{1-p2}N$ layer 127c may exceed that of the quantum wall 114b, but the embodiment is not limited thereto.

According to the embodiment, the plane-directional lattice constant of one of the first $In_{p1}Ga_{1-p1}N$ layer 127a and the second $In_{p2}Ga_{1-p2}N$ layer 127c of the last barrier layer 127 may be same to or greater than that of the quantum wall 114b in the active layer, so that the stress applied from the last barrier layer 127 to the quantum wall 114b may be relieved. Thus, the internal field applied to the quantum well 114w in the active layer is reduced so that the light emitting coupling probability of electrons and holes in the quantum well may be increased, thereby improving the light emitting efficiency. Accordingly, the last barrier layer 127 according to the embodiment may minimize the stress applied to the active layer, and at the same time, may effectively confine electrons based on quantum mechanics.

In addition, the plane-directional lattice constants of the first $In_{p1}Ga_{1-p1}N$ layer 127a and the second $In_{p2}Ga_{1-p2}N$ layer 127c may be greater than that of the $Al_{q1}In_{q2}Ga_{1-q1-q2}N$ layer 127d, so that the stress applied from the $Al_{q1}In_{q2}Ga_{1-q1-q2}N$ layer 127d to the quantum well 114w may be relieved. Thus, the internal field applied to the quantum well 114w in the active layer 114 is reduced so that the light emitting coupling probability of electrons and holes in the quantum well may be increased, thereby improving the light emitting efficiency.

Accordingly, the undoped last barrier layer 127 according to the embodiment may minimize the stress applied to the active layer, and at the same time, may effectively confine electrons based on quantum mechanics. In addition, the plane-directional lattice constants of the first $In_{p1}Ga_{1-p1}N$ layer 127a and the second $In_{p2}Ga_{1-p2}N$ layer 127c are less than that of the quantum well 114w of the active layer 114, so that the electrons may be effectively confined in the quantum well having the relatively greater lattice constant.

In addition, according to the embodiment, since the $Al_{q1}In_{q2}Ga_{1-q1-q2}N$ layer 127d is not doped with P type dopants and the lattice constant of the $Al_{q1}In_{q2}Ga_{1-q1-q2}N$ layer 127d in the surface direction is less than the lattice constants of the first $In_{p1}Ga_{1-p1}N$ layer 127a and the second $In_{p2}Ga_{1-p2}N$ layer 127c, the diffusion of P type dopant from the second conductive type semiconductor layer 116 toward the active layer 114 may be effectively blocked, so that the long-term reliability of a device may be improved.

In addition, according to the embodiment, since the $Al_{q1}In_{q2}Ga_{1-q1-q2}N$ layer 127d is not doped with P type dopants and the lattice constant of the $Al_{q1}In_{q2}Ga_{1-q1-q2}N$ layer 127d in the surface direction is less than the lattice constants of the first $In_{p1}Ga_{1-p1}N$ layer 127a and the second $In_{p2}Ga_{1-p2}N$ layer 127c, the diffusion of P type dopants from the second conductive type semiconductor layer 116 toward the active layer 114 may be effectively blocked, so that the long-term reliability of a device may be improved.

Then, the energy bandgap of the $Al_{q1}In_{q2}Ga_{1-q1-q2}N$ layer 127d may be different from that of the $Al_xIn_yGa_{(1-x-y)}N$-based layer 128, so that the electrons in the quantum well may be more effectively confined. For example, the energy bandgap of the $Al_{q1}In_{q2}Ga_{1-q1-q2}N$ layer 127d may be equal to or greater than that of the $Al_xIn_yGa_{(1-x-y)}N$-based layer 128, so that the electrons in the quantum well may be more effectively confined.

In addition, according to the embodiment, since as the $Al_{q1}In_{q2}Ga_{1-q1-q2}N$ layer 127d includes Al so that an energy level of the energy bandgap of the $Al_{q1}In_{q2}Ga_{1-q1-q2}N$ layer 127d may be relatively high, the energy bandgap of the $Al_{q1}In_{q2}Ga_{1-q1-q2}N$ layer 127d may be greater than those of the first $In_{p1}Ga_{1-p1}N$ layer 127a and the second $In_{p2}Ga_{1-p2}N$ layer 127c.

In addition, the energy bandgap of the $Al_{q1}In_{q2}Ga_{1-q1-q2}N$ layer 127d may be greater than that of the quantum wall 114b of the active layer 114. Since the energy bandgaps of the first $In_{p1}Ga_{1-p1}N$ layer 127a and the second $In_{p2}Ga_{1-p2}N$ layer 127c are greater than that of the quantum well 114w of the active layer 114, the electrons in the quantum well may be effectively defined. In addition, since the energy bandgap of the $Al_{q1}In_{q2}Ga_{1-q1-q2}N$ layer 127d in the undoped last barrier layer 127 is greater than that of the quantum wall in the active layer, the electrons in the quantum well may be effectively confined.

According to the embodiment, a thickness of the Alq1Inq2Ga1-q1-q2N layer 127d is less than that of the first Inp1Ga1-p1N layer 127a or the second Inp2Ga1-p2N layer 127c. Thus, the region occupied by the Alq1Inq2Ga1-q1-q2N layer 127d is minimized so that the stress applied to the quantum well 114w may be relieved. Thus, the internal field applied to the quantum well 114w in the active layer 114 is reduced, so that the light emitting coupling probability of electrons and holes in the quantum well may be increased, thereby improving the light emitting efficiency.

In addition, the thickness of the Alq1Inq2Ga1-q1-q2N layer 127d is in the range of 1 nm to 5 nm. Since the quantum mechanical electron confinement effect deteriorates when the thickness of the Alq1Inq2Ga1-q1-q2N layer 127d is less than 1 nm, the Alq1Inq2Ga1-q1-q2N layer 127d may have a thickness of 1 nm or more. Since the carrier (hole) injection efficiency from the second conductive type semiconductor layer 116 to the active layer 114 may deteriorate when the thickness of the Alq1Inq2Ga1-q1-q2N layer 127d exceeds 5 nm, the thickness of the Alq1Inq2Ga1-q1-q2N layer 127d may have a thickness of 5 nm or less.

Figure 4:
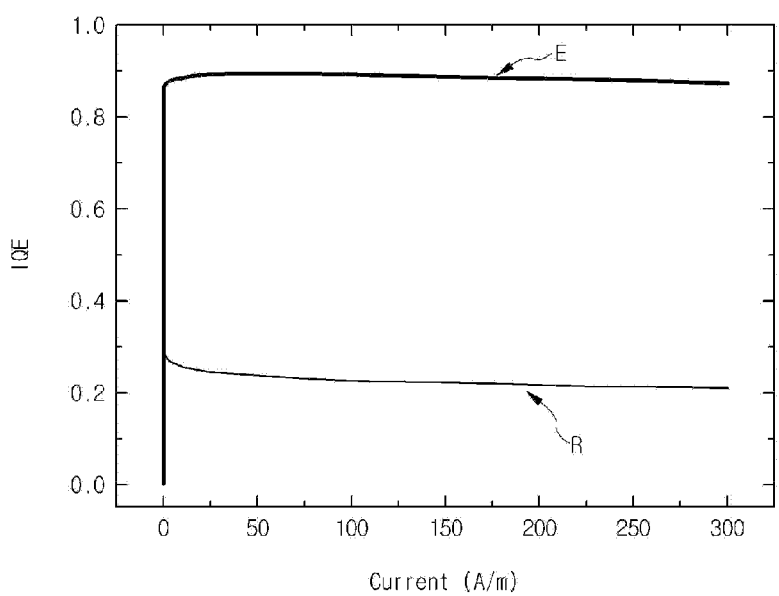
FIG. 4 is a graph illustrating internal quantum efficiency of a light emitting device according to the embodiment.

FIG. 4 is a graph illustrating internal quantum efficiency (IQE) of a light emitting device and IQE of a comparative example R according to the embodiment E. The comparative example R is an example of employing a GaN last barrier of 7 mm. The embodiment E is an experimental example in which the undoped last barrier layer 127 includes a first Inp1Ga1-p1N layer 127a, the Alq1Inq2Ga1-q1-q2N layer and the second Inp2Ga1-p2N layer 127c. In case of the comparative example R, when the current is 300 A/m, the internal quantum efficiency is about 21%, but in case of the embodiment E, the internal quantum efficiency is about 87%. Thus, the embodiment obtains an innovative effect.

According to the embodiment, a light emitting device including an optimal structure capable of increasing the intensity of light, a method of manufacturing the same, a light emitting device package, and a lighting system may be provided. In addition, according to the embodiment, a light emitting device capable of minimizing the stress applied to a quantum well and effectively increasing a quantum confinement effect, a method of manufacturing the same, a light emitting device package, and a lighting system may be provided. Thus, according to the embodiment, a light emitting device capable of improving a quantum confinement effect, light emitting efficiency, and device reliability, a method of manufacturing the same, a light emitting device package, and a lighting system may be provided.

Figure 5:
FIGS. 5 to 8 are sectional views illustrating a method of manufacturing a light emitting device according to the embodiment.

Hereinafter, a method of manufacturing a light emitting device according to the embodiment will be described with reference to FIGS. 5 to 8. According to a method of manufacturing a light emitting device of the embodiment, as shown in FIG. 5, a first conductive type semiconductor layer 112, an active layer 114 and a second conductive type semiconductor layer 116 on a substrate 5 may be formed. The first conductive type semiconductor layer 112, the active layer 114 and the second conductive type semiconductor layer 116 may be defined as a light emitting structure 110.

For example, the substrate 5 may be formed of at least one of Al2O3, SiC, Si, GaAs, GaN, ZnO, GaP, InP, and Ge, but the embodiment is not limited thereto. A buffer layer (14) may be further disposed between the first conductive type semiconductor layer 112 and the substrate 5.

For example, the first conductive type semiconductor layer 112 may be prepared as an n type semiconductor layer doped with an n type dopant as a first conductive dopant, and the second conductive type semiconductor layer 116 may be prepared as a p type semiconductor layer doped with a p type dopant as a second conductive dopant. In contrast, the first conductive type semiconductor layer 112 may be prepared as the p type semiconductor layer and the second conductive type semiconductor layer 116 may be prepared as an n type semiconductor layer.

For example, the first conductive type semiconductor layer 112 may include an n type semiconductor layer. The first conductive type semiconductor layer 112 may be prepared by using a semiconductor material having a compositional formula of InxAlyGa1-x-yN ($0 \leq x \leq 1$, $0 \leq y \leq 1$, $0 \leq x+y \leq 1$). For instance, the first conductive type semiconductor layer 112 may include at least one selected from the group consisting of InAlGaN, GaN, AlGaN, AlInN, InGaN, AlN and InN and may be doped with the n type dopant, such as Si, Ge, Sn, Se or Te.

The active layer 114 emits the light based on the band gap difference of the energy band according to a material constituting the active layer 114 through the recombination of electrons (or holes) injected through the first conductive type semiconductor layer 112 and holes (or electrons) injected through the second conductive type semiconductor layer. The active layer 114 may have one of a single quantum well structure, a multiple quantum well (MQW) structure, a quantum dot structure, and a quantum wire structure, but the embodiment is not limited thereto.

The active layer 114 may include a semiconductor material having a compositional formula of InxAlyGa1-x-yN ($0 \leq x \leq 1$, $0 \leq y \leq 1$, $0 \leq x+y \leq 1$). If the active layer 114 has the MQW structure, the active layer 114 may have a stack structure of a plurality of quantum wells 114w and a plurality of quantum walls 114b.

Next, according to the embodiment, the undoped last barrier layer 127 may be disposed on the active layer 114, the AlxInyGa(1−x−y)N ($0 \leq x \leq 1$, $0 \leq y \leq 1$)-based layer 128 may be disposed on the undoped last barrier layer 127 and the second conductive type semiconductor layer 116 may be disposed on the AlxInyGa(1−x−y)N-based layer 128.

The AlxInyGa(1−x−y)N-based layer 128 may perform the functions of electron blocking and MQW cladding, so that the light emitting efficiency may be improved. The AlxInyGa(1−x−y)N-based layer 128 may have an energy bandgap greater than that of the active layer 114. The AlxInyGa(1−x−y)N-based layer 128 may be formed in a superlattice structure, but the embodiment is not limited thereto. In addition, the AlxInyGa(1−x−y)N-based layer 128 may be doped with P-type impurities through an ion-implanting scheme, so that to the AlxInyGa(1−x−y)N-based layer 128 may effectively block the overflowing electrons and may improve the hole injection efficiency.

Figure 6:
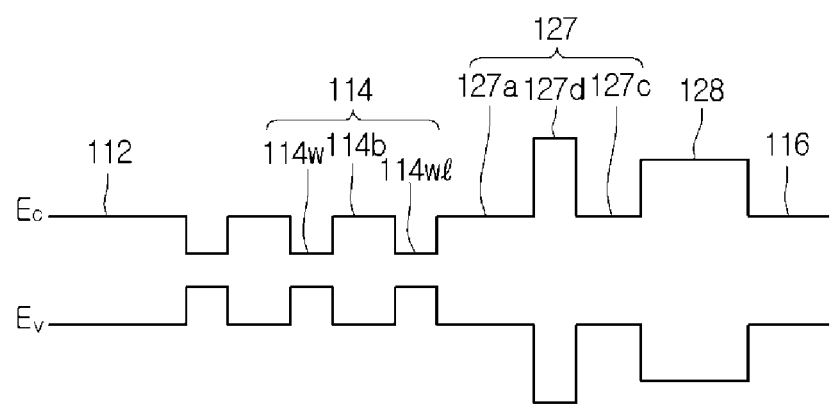

As shown in FIG. 6, the last barrier layer 127 according to the embodiment may include a first Inp1Ga1-p1N ($0<p1<1$) layer 127a, an Alq1Inq2Ga1-q1-q2N ($0<q1$, $q2<1$) layer 127d on the first Inp1Ga1-p1N layer 127a, and a second Inp2Ga1-p2N ($0<p2<1$) layer 127c on the Alq1Inq2Ga1-q1-q2N layer 127d.

The plane-directional lattice constant of the Alq1Inq2Ga1-q1-q2N layer 127d may be equal to or greater than that of the quantum wall 114b. In addition, according to the embodiment, the concentration q2 of In in the Alq1Inq2Ga1-q1-q2N layer 127d is controlled in the range of $0.16 \leq q2 \leq 0.2$ and the plane-directional lattice constant of the Alq1Inq2Ga1-q1-q2N layer 127d is controlled to be equal to or greater than that of the quantum wall 114b. In addition, the plane-directional lattice constants of the first $In_{p1}Ga_{1-p1}N$ layer 127a and the second $In_{p2}Ga_{1-p2}N$ layer 127c may be equal to or greater than that of the quantum wall 114b.

According to the embodiment, the plane-directional lattice constant of one of the first $In_{p1}Ga_{1-p1}N$ layer 127a, the $Al_{q1}In_{q2}Ga_{1-q1-q2}N$ layer 127d, and the second $In_{p2}Ga_{1-p2}N$ layer 127c of the last barrier layer 127 may be same to or greater than that of the quantum wall 114b in the active layer, so that the last barrier layer 127 may minimize the stress applied to the active layer, and at the same time, may effectively confine electrons based on quantum mechanics.

In addition, the plane-directional lattice constants of the first $In_{p1}Ga_{1-p1}N$ layer 127a and the second $In_{p2}Ga_{1-p2}N$ layer 127c may be greater than that of the $Al_{q1}In_{q2}Ga_{1-q1-q2}N$ layer 127d, so that the stress applied from the $Al_{q1}In_{q2}Ga_{1-q1-q2}N$ layer 127d to the quantum well 114w may be relieved. A last quantum well 114w1 may be disposed between the first $In_{p1}Ga_{1-p1}N$ layer 127a and the quantum wall 114b.

In addition, the plane-directional lattice constants of the first $In_{p1}Ga_{1-p1}N$ layer 127a and the second $In_{p2}Ga_{1-p2}N$ layer 127c are less than that of the quantum well 114w of the active layer 114, so that the electrons may be effectively confined in the quantum well having the relatively greater lattice constant.

In addition, according to the embodiment, since the $Al_{q1}In_{q2}Ga_{1-q1-q2}N$ layer 127d is not doped with P type dopants and the lattice constant of the $Al_{q1}In_{q2}Ga_{1-q1-q2}N$ layer 127d in the surface direction is less than the lattice constants of the first $In_{p1}Ga_{1-p1}N$ layer 127a and the second $In_{p2}Ga_{1-p2}N$ layer 127c, the diffusion of P type dopants, from the second conductive type semiconductor layer 116 toward the active layer 114 may be effectively blocked, so that the long-term reliability of a device may be improved.

In addition, according to the embodiment, since the $Al_{q1}In_{q2}Ga_{1-q1-q2}N$ layer 127d is not doped with P type dopants and the lattice constant of the $Al_{q1}In_{q2}Ga_{1-q1-q2}N$ layer 127d in the surface direction is less than the lattice constants of the first $In_{p1}Ga_{1-p1}N$ layer 127a and the second $In_{p2}Ga_{1-p2}N$ layer 127c, the diffusion of P type dopants, from the second conductive type semiconductor layer 116 toward the active layer 114 may be effectively blocked, so that the long-term reliability of a device may be improved.

Then, the energy bandgap of the $Al_{q1}In_{q2}Ga_{1-q1-q2}N$ layer 127d may be equal to or greater than that of the $Al_xIn_yGa_{(1-x-y)}N$-based layer 128, so that the electrons in the quantum well may be more effectively confined. In addition, according to the embodiment, since as the $Al_{q1}In_{q2}Ga_{1-q1-q2}N$ layer 127d includes Al so that an energy level of the energy bandgap of the $Al_{q1}In_{q2}Ga_{1-q1-q2}N$ layer 127d may be relatively high, the energy bandgap of the $Al_{q1}In_{q2}Ga_{1-q1-q2}N$ layer 127d may be greater than those of the first $In_{p1}Ga_{1-p1}N$ layer 127a and the second $In_{p2}Ga_{1-p2}N$ layer 127c. In addition, the energy bandgap of the $Al_{q1}In_{q2}Ga_{1-q1-q2}N$ layer 127d may be greater than that of the quantum wall 114b of the active layer 114.

Since the energy bandgaps of the first $In_{p1}Ga_{1-p1}N$ layer 127a and the second $In_{p2}Ga_{1-p2}N$ layer 127c are greater than that of the quantum wall 114w of the active layer 114, the electrons in the quantum well may be effectively defined. In addition, since the energy bandgap of the $Al_{q1}In_{q2}Ga_{1-q1-q2}N$ layer 127d in the undoped last barrier layer 127 is greater than that of the quantum wall in the active layer, the electrons in the quantum well may be effectively confined.

According to the embodiment, a thickness of the $Al_{q1}In_{q2}Ga_{1-q1-q2}N$ layer 127d is less than that of the first $In_{p1}Ga_{1-p1}N$ layer 127a or the second $In_{p2}Ga_{1-p2}N$ layer 127c. In addition, the thickness of the $Al_{q1}In_{q2}Ga_{1-q1-q2}N$ layer 127d may be in the range of 1 nm to 5 nm.

Next, the second conductive type semiconductor layer 116 may include a p type semiconductor layer. The second conductive type semiconductor layer 116 may include at least one selected from the group consisting of, for example, InAlGaN, GaN, AlGaN, InGaN, AlInN, AlN and InN and may be doped with the p type dopant, such as Mg, Zn, Ca, Sr or Ba.

Meanwhile, the first conductive type semiconductor layer 112 may include a p type semiconductor layer, and the second conductive type semiconductor layer 116 may include an n type semiconductor layer. In addition, a semiconductor layer including an n type semiconductor layer or a p type semiconductor layer may be further disposed on the second conductive type semiconductor layer 116. Accordingly, the light emitting structure may have at least one of n-p, p-n, n-p-n, and p-n-p junction structures. In addition, the doping concentrations of impurities in the first conductive type semiconductor layers 112 and the second conductive type semiconductor layer 116 may be uniform or non-uniform. In other words, the light emitting structure 110 may be variously formed, but the embodiment is not limited thereto.

Figure 7:
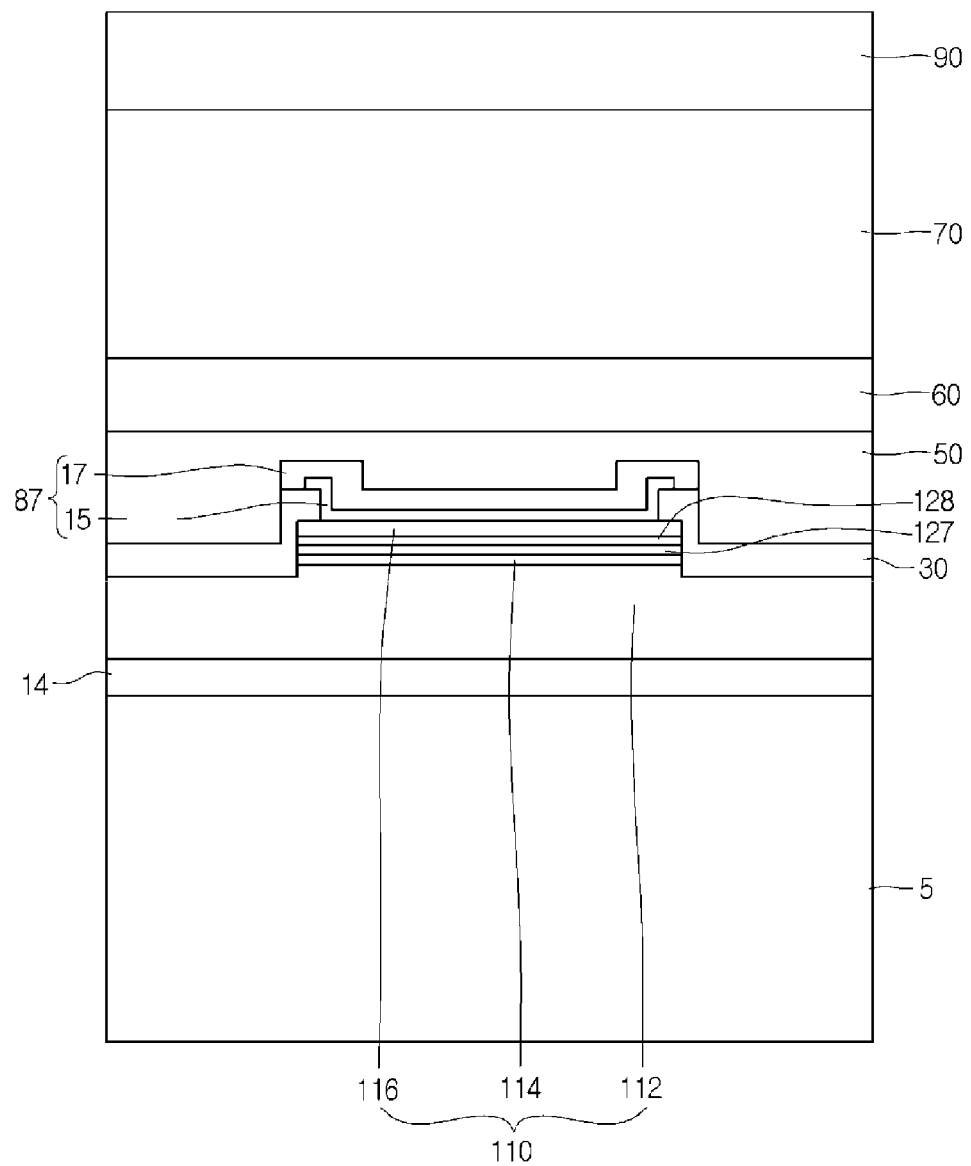

Next, as shown in FIG. 7, the light emitting structure 110 may be etched such that a region of the first conductive type semiconductor layer 112 may be exposed. In this case, the etching may include a wet etching or a dry etching. Thereafter, a channel layer 30, an ohmic layer 15 and a reflective layer 17 may be disposed on the light emitting structure 110. The ohmic layer 15 and the reflective layer 17 may be a bottom conductive layer 87. The channel layer 30 may be formed in a single or a multi-layer structure. For example, the channel layer 30 may be formed of at least one selected from the group consisting of SiO2, SixOy, Si3N4, SixNy, SiOxNy, Al2O3, TiO2 and AlN.

The ohmic layer 15 may be disposed between the reflective layer 17 and the second conductive type semiconductor layer 116. The ohmic layer 15 may be disposed to make contact with the second conductive type semiconductor layer 116. The ohmic layer 15 may be formed to make ohmic contact with the light emitting structure 110. The reflective layer 17 may be electrically connected to the second conductive type semiconductor layer 116. The ohmic layer 15 may include a region which makes ohmic contact with the light emitting structure 110.

For example, the ohmic layer 15 may be formed of a transparent conductive oxide layer. The ohmic layer 15 may be formed in a single or a multi-layer structure. For example, the ohmic layer 15 may be formed of at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective layer 17 may be formed of a material having a high reflectance. For example, the reflective layer 17 may include metal including at least one of Ag, Ni, Al, Rh, Pd, Ir, Ru, Mg, Zn, Pt, Cu, Au, Hf and the alloy thereof. In addition, the reflective layer 17 may be formed in a single or a multi-layer structure by using the metal or the alloy and a transmissive conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), or antimony-tin-oxide (ATO). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately disposed, and may include Ni/Ag/Ni or a Ti layer and a Pt layer. A metal layer 50, a bonding layer 60, a supporting member 70 and a temporary substrate 90 may be disposed on the reflective layer 17. The metal layer 50 may include at least one among Au, Cu, Ni, Ti, Ti—W, Cr, W, Pt, V, Fe and Mo. The metal layer may serve as a diffusion barrier layer.

According to the embodiment, a first electrode layer, which is electrically connected to the second conductive type semiconductor layer 116, may include at least one among a reflective layer, an ohmic layer and a metal layer. According to the embodiment, the first electric layer may include all of the reflective layer, the ohmic layer and the metal layer, or one or two among the layers.

The metal layer 50 may prevent a material contained in the bonding layer 60 from being diffused toward the reflective layer 17 in the process of providing the bonding layer 60. For example, the metal layer 50 may prevent a material such as tin (Sn) contained in the bonding layer 60 from exerting an influence on the reflective layer 17.

The bonding layer 60 includes barrier metal or bonding metal. For example, the bonding layer 60 may include at least one selected from the group consisting of Ti, Au, Sn, Ni, Cr, Ga, In, Bi, Cu, Ag, Nb, Pd and Ta. The support member 70 may support the light emitting device according to the embodiment and may perform a heat dissipation function. The bonding layer 60 may be implemented in the form of a seed layer.

For example, the support member 70 may include at least one of semiconductor substrates (e.g., Si, Ge, GaN, GaAs, ZnO, SiC, or SiGe substrates) implanted with Ti, Cr, Ni, Al, Pt, Au, W, Cu, Mo, Cu—W, or impurities. Further, the support member 70 may be formed of an insulating material.

The temporary substrate 90 may be disposed on the support member 70. The temporary substrate 90 may be formed of a metal material, a semiconductor material or an insulating material.

Figure 8:
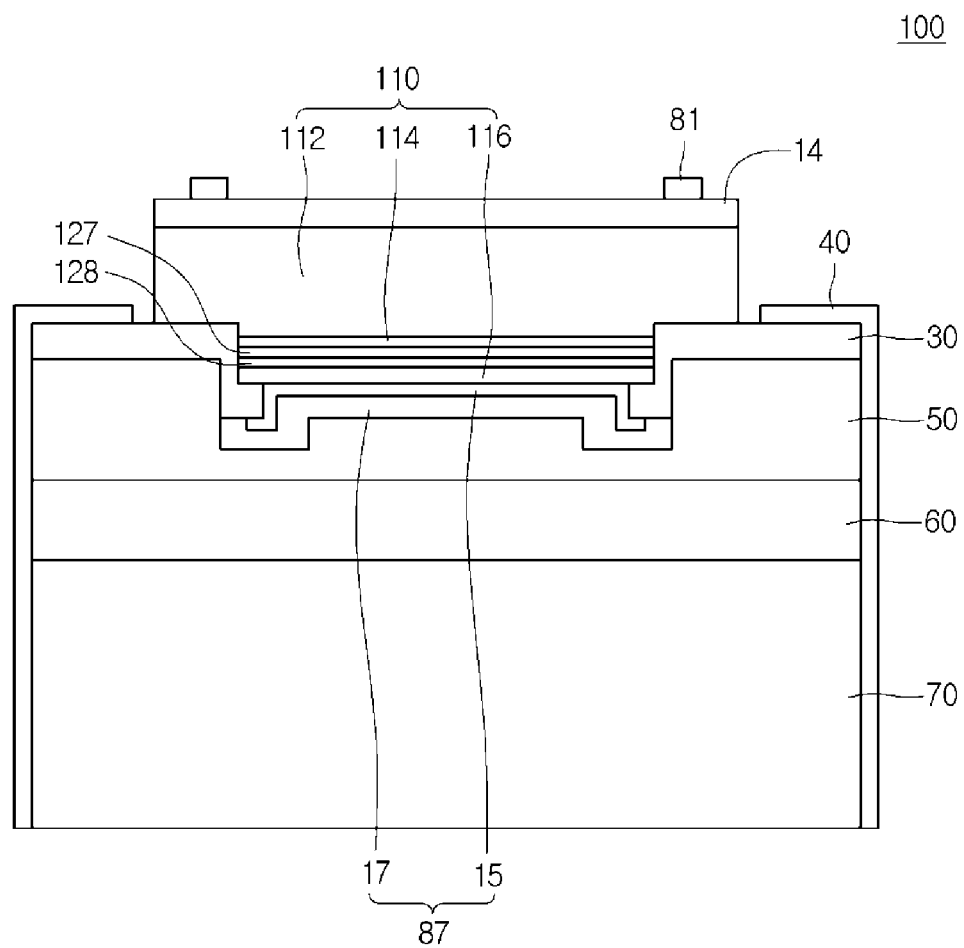

Next, as shown in FIG. 8, the substrate 5 is removed from the light emitting structure 110. As one example, the substrate 5 may be removed through a laser lift off (LLO) process. The LLO process is a process to laminate the substrate 5 from the light emitting structure 110 by irradiating a laser to the bottom surface of the substrate 5.

Then, an isolation etching process, a pad electrode 81 forming process, a scribing process, a reflective part 40 forming process, and a temporary substrate 90 removing process may be performed. The above-mentioned processes are presented for the illustrative purpose, and the process sequence may be variously modified.

According to the embodiment, the side surface of the light emitting structure 110 may be etched through an isolation etching process to expose a portion of the channel layer 30. The isolation etching process may be performed through a dry etching process such as inductively coupled plasma (ICP), but the embodiment is not limited thereto.

The roughness (not shown) may be formed on the top surface of the light emitting structure 110. A concave-convex pattern may be provided on the light emitting structure 110. For example, the light extraction pattern provided on the light emitting structure 110 may be formed through a PEC (photo electro chemical) etching process. Thus, according to the embodiment, as a light extraction pattern may be provided on the light emitting structure 110, the external light extraction effect can be increased.

Next, a pad electrode 81 may be disposed on an electrode layer 14 after the electrode layer 14 is disposed on the light emitting structure 110. The pad electrode 81 may be electrically connected to the first conductive type semiconductor layer 112. A portion of the pad electrode 81 may make contact with the first conductive type semiconductor layer 112.

The pad electrode 81 may be one layer or multi layers. For example, the pad electrode 81 may include an ohmic layer, an intermediate layer, and an upper layer. The ohmic layer may include a material selected from the group consisting of Cr, V, W, Ti, and Zn, and may make ohmic contact. The intermediate layer may be implemented by using a material selected from the group consisting of Ni, Cu, and Al. For example, the upper layer may include Au. The pad electrode 81 may include at least one selected from the group consisting of Cr, V, W, Ti, Zn, Ni, Cu, Al and Au.

Then, the scribing process may be performed such that the channel layer 30 and a side surface of the support member 70 may be exposed. Then, the reflective part 40 may be disposed on side surfaces of the channel layer 30 and the support member 70. Thereafter, by removing the temporary substrate 90, an individual light emitting device may be formed.

According to the embodiment, the reflective part 40 may be disposed on the channel layer 30. The reflective part 40 may be disposed on the channel layer 30 to make contact with the channel layer 30. The reflective part 40 may make contact with the channel layer 30. The reflective part 40 may be disposed on a side surface of the support member 70. The reflective part 40 may make contact with the side surface of the support member 70. According to the embodiment, the reflective part 40 may include a first region disposed on the channel layer 30 and a second region disposed on the side surface of the support member 70, where the first and second regions are connected to each other.

In addition, the reflective part 40 may be disposed on a side surface of the metal layer 50. The reflective part 40 may be disposed on a side surface of the bonding layer 60. The reflective part 40 may make contact with the side surface of the bonding layer 60. The reflective part 40 may be spaced apart from the light emitting structure 110. The reflective part 40 may be implemented by using a material having a good reflectance. For example, the reflective part 40 may include at least one selected from the group consisting of Ag, Al and Pt.

The reflective part may prevent the light, which is emitted from the light emitting structure 110 and incident upon the channel layer 30, the metal layer 50, the bonding layer 60 and the support member 70, from being absorbed into the channel layer 30, the metal layer 50, the bonding layer 50 and the support member 70. That is, the reflective part 40 reflects the light incident thereupon, so that the light may be prevented from being absorbed into the channel layer 30, the metal layer 50, the bonding layer 60 and the support member 70 and eclipsed.

As the reflective part 40 is disposed, even though roughness is formed on one among the side surfaces of the channel layer 30, the metal layer 50, the bonding layer 60 and the support member 70, the side surface of the light emitting device according to the embodiment may become entirely smooth. That is, since the surface of the reflective part 40 is smoothly formed, even though roughness or a burr is formed on one among the side surfaces of the metal layer 50, the bonding layer 60 and the support member, the side surface of the light emitting device according to the embodiment may be formed to be entirely smooth.

According to the embodiment, a light emitting device including an optimal structure capable of increasing the intensity of light, a method of manufacturing the same, a light emitting device package, and a lighting system may be provided. In addition, according to the embodiment, a light emitting device capable of minimizing the stress applied to a quantum well and effectively increasing a quantum confinement effect, a method of manufacturing the same, a light emitting device package, and a lighting system may be provided. Thus, according to the embodiment, a light emitting device capable of improving a quantum confinement effect, light emitting efficiency, and device reliability, a method of manufacturing the same, a light emitting device package, and a lighting system may be provided.

Figure 9:
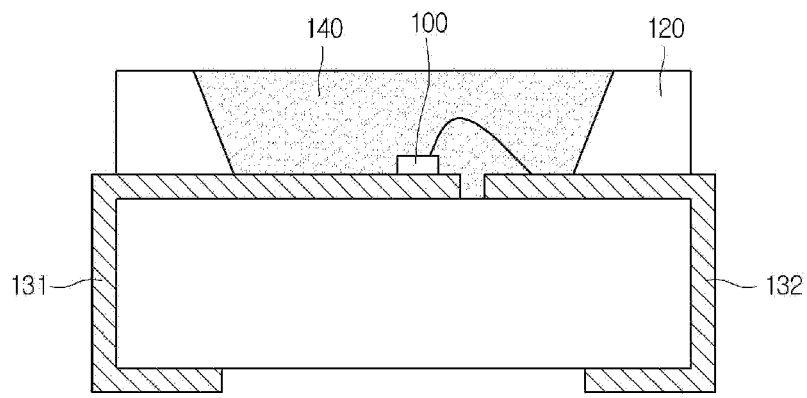
FIG. 9 is a sectional view showing a light emitting device package according to the embodiment.

FIG. 9 is a sectional view showing a light emitting device package to which the light emitting device according to the embodiment is applied. Referring to FIG. 9, the light emitting device package according to the embodiment may include a body 120, first and second lead electrodes 131 and 132 disposed in the body 120, a light emitting device 100 disposed in the body 120 and electrically connected to the first and second lead electrodes 131 and 132 and a molding member 140 that surrounds the light emitting device 100.

The body 120 may include silicon, synthetic resin or metallic material, and an inclined surface may be disposed in the vicinity of the light emitting device 100.

The first and second lead electrodes 131 and 132 are electrically isolated from each other to supply power to the light emitting device 100. The first and second lead electrodes 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be disposed on the body 120 or the first or second lead electrode 131 or 132. The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may include phosphors to change the wavelength of the light emitted from the light emitting device 100.

A plurality of light emitting device or light emitting device packages according to the embodiment may be arrayed on a substrate, and an optical member including a lens, a light guide plate, a prism sheet, or a diffusion sheet may be disposed on the optical path of the light emitted from the light emitting device package. The light emitting device package, the substrate, and the optical member may serve as a light unit. The light unit is formed in a top view type or a side view type and variously provided in display devices of a portable terminal and a laptop computer or a lighting apparatus and an indicator apparatus.

In addition, a lighting apparatus according to another embodiment can include a light emitting device, or a light emitting device package according to the embodiment. For example, the lighting apparatus may include a lamp, a signal lamp, an electric sign board and a headlight of a vehicle. In addition, the lighting apparatus may be applied to a taillight of a vehicle as well as the headlight of the vehicle. The light emitting device according to the embodiment may be applied to the light unit. The light unit has a structure in which a plurality of light emitting devices are arrayed. The light unit may include a display device and the lighting apparatus.

Figure 10:
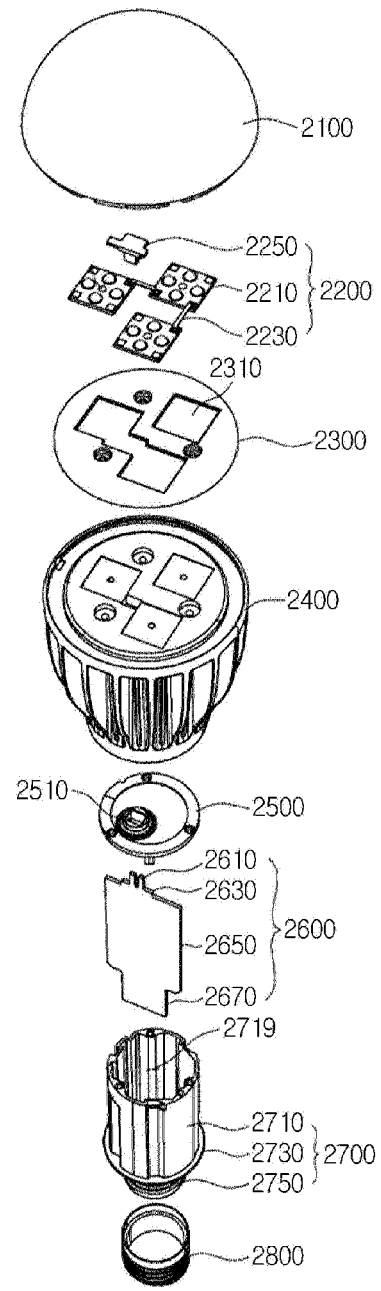
FIG. 10 is an exploded view showing a light unit according to the embodiment.

FIG. 10 is an exploded perspective view showing a lighting apparatus according to the embodiment. Referring to FIG. 10, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be a kind of an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The surface roughness of the inner surface of the cover 2100 may be greater than the roughness of the outer surface of the cover 2100. The surface roughness is provided for the purpose of sufficiently scattering and diffusing the light from the light source module 2200 to discharge the light to the outside.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be disposed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500. The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device capable of increasing the intensity of light, a method of manufacturing the same, a light emitting device package, and a lighting system.

According to the embodiment, there is provided a light emitting device including: a first conductive type semiconductor layer; an active layer including a quantum well and a quantum wall on the first conductive type semiconductor layer, an undoped last barrier layer on the active layer; an $Al_xIn_yGa_{(1-x-y)}N$ (0≤x≤1, 0≤y≤1)-based layer on the undoped last barrier layer; and a second conductive type semiconductor layer on the $Al_xIn_yGa_{(1-x-y)}N$ (0≤x≤1, 0≤y≤1)-based layer.

The last barrier layer includes a first $In_{p1}Ga_{1-p1}N$ (0<$p_1$<1) layer on a last quantum well which is closest to the second conductive type semiconductor layer among the quantum well; an $Al_{q1}In_{q2}Ga_{1-q1-q2}N$ (0<q, q2<1) layer on the first $In_{p1}Ga_{1-p1}N$ layer; and a second $In_{p2}Ga_{1-p2}N$ (0<p2<1) layer on the $Al_{q1}In_{q2}Ga_{1-q1-q2}N$ layer.

An energy bandgap of the $Al_{q1}In_{q2}Ga_{1-q1-q2}N$ layer is different from an energy bandgap of the $Al_xIn_yGa_{(1-x-y)}N$-based layer.

An energy bandgap of the $Al_{q1}In_{q2}Ga_{1-q1-q2}N$ layer is equal to or greater than an energy bandgap of the $Al_xIn_yGa_{(1-x-y)}N$-based layer.

A lighting system according to the embodiment may include a light emitting unit having the light emitting device.

According to the embodiment, a light emitting device including an optimal structure capable of increasing the intensity of light, a method of manufacturing the same, a light emitting device package, and a lighting system may be provided.

In addition, according to the embodiment, a light emitting device capable of minimizing the stress applied to a quantum well and effectively increasing a quantum confinement effect, a method of manufacturing the same, a light emitting device package, and a lighting system may be provided.

Thus, according to the embodiment, a light emitting device capable of improving a quantum confinement effect, light emitting efficiency, and device reliability, a method of manufacturing the same, a light emitting device package, and a lighting system may be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
  a first conductive type semiconductor layer;
  an active layer including a plurality of quantum wells and a plurality of quantum walls on the first conductive type semiconductor layer,
  an undoped last barrier layer on the active layer;
  an $Al_xIn_yGa_{(1-x-y)}N$ (0≤x≤1, 0≤y≤1)-based layer on the undoped last barrier layer; and
  a second conductive type semiconductor layer on the $Al_xIn_yGa_{(1-x-y)}N$ (0≤x≤1, 0≤y≤1)-based layer,
  wherein the undoped last barrier layer is provided between the $Al_xIn_yGa_{(1-x-y)}N$ (0≤x≤1, 0≤y≤1)-based layer and a last quantum well closest to the second conductive type semiconductor layer among the plurality of quantum wells, and the undoped last barrier layer includes:
    a first $In_{p1}Ga_{1-p1}N$ (0<p1<1) layer on the last quantum well closest to the second conductive type semiconductor layer among the plurality of quantum wells;
    an $Al_{q1}In_{q2}Ga_{1-q1-q2}N$ (0<q1, q2<1) layer on the first $In_{p1}Ga_{1-p1}N$ (0<p1<1) layer; and a second $In_{p2}Ga_{1-p2}N$ ($0<p2<1$) layer on the $Al_{q1}In_{q2}Ga_{1-q1-q2}N$ ($0<q1, q2<1$) layer, wherein an energy band gap of the $Al_{q1}In_{q2}Ga_{1-q1-q2}N$ ($0<q1, q2<1$) layer is greater than an energy band gap of the $Al_xIn_yGa_{(1-x-y)}N$ ($0\le x\le 1, 0\le y\le 1$)-based layer, the $Al_xIn_yGa_{(1-x-y)}N$ ($0\le x\le 1, 0\le y\le 1$)-based layer being an electron blocking layer, wherein the $Al_{q1}In_{q2}Ga_{1-q1-q2}N$ ($0<q1, q2<1$) layer is directly provided between the first $In_{p1}Ga_{1-p1}N$ ($0<p1<1$) layer and the second $In_{p2}Ga_{1-p2}N$ ($0<p2<1$) layer, and wherein lattice constants of the first $In_{p1}Ga_{1-p1}N$ ($0<p1<1$) layer and the second $In_{p2}Ga_{1-p2}N$ ($0<p2<1$) layer in a surface direction are greater than a lattice constant of the $Al_{q1}In_{q2}Ga_{1-q1-q2}N$ ($0<q1, q2<1$) layer in a surface direction.

2. The light emitting device of claim 1, wherein the lattice constant of the $Al_{q1}In_{q2}Ga_{1-q1-q2}N$ ($0<q1, q2<1$) layer in the surface direction is different from a lattice constant of the quantum walls in a surface direction.

3. The light emitting device of claim 1, wherein the lattice constant of the $Al_{q1}In_{q2}Ga_{1-q1-q2}N$ ($0<q1, q2<1$) layer in the surface direction is equal to or greater than a lattice constant of the quantum walls in a surface direction.

4. The light emitting device of claim 1, wherein the lattice constants of the first $In_{p1}Ga_{1-p1}N$ ($0<p1<1$) layer and the second $In_{p2}Ga_{1-p2}N$ ($0<p2<1$) layer in the surface direction are different from a lattice constant of the quantum walls in a surface direction.

5. The light emitting device of claim 1, wherein the lattice constants of the first $In_{p1}Ga_{1-p1}N$ ($0<p1<1$) layer and the second $In_{p2}Ga_{1-p2}N$ ($0<p2<1$) layer in the surface direction are equal to or greater than a lattice constant of the quantum walls in a surface direction.

6. The light emitting device of claim 1, wherein the lattice constants of the first $In_{p1}Ga_{1-p1}N$ ($0<p1<1$) layer and the second $In_{p2}Ga_{1-p2}N$ ($0<p2<1$) layer in the surface direction are less than a lattice constant of the quantum walls of the active layer in a surface direction.

7. The light emitting device of claim 1, wherein an energy bandgap of the $Al_{q1}In_{q2}Ga_{1-q1-q2}N$ ($0<q1, q2<1$) layer is greater than energy bandgaps of the first $In_{p1}Ga_{1-p1}N$ ($0<p1<1$) layer and the second $In_{p2}Ga_{1-p2}N$ ($0<p2<1$) layer.

8. The light emitting device of claim 1, wherein an energy bandgap of the $Al_{q1}In_{q2}Ga_{1-q1-q2}N$ ($0<q1, q2<1$) layer is greater than an energy bandgap of the quantum walls of the active layer.

9. The light emitting device of claim 1, wherein energy bandgaps of the first $In_{p1}Ga_{1-p1}N$ ($0<p1<1$) layer and the second $In_{p2}Ga_{1-p2}N$ ($0<p2<1$) layer are greater than an energy bandgap of the quantum wells of the active layer.

10. The light emitting device of claim 1, wherein a thickness of the $Al_{q1}In_{q2}Ga_{1-q1-q2}N$ ($0<q1, q2<1$) layer is less than a thickness of the first $In_{p1}Ga_{1-p1}N$ ($0<p1<1$) layer.

11. The light emitting device of claim 1, wherein a thickness of the $Al_{q1}In_{q2}Ga_{1-q1-q2}N$ ($0<q1, q2<1$) layer is less than a thickness of the second $In_{p2}Ga_{1-p2}N$ ($0<p2<1$) layer.

12. The light emitting device of claim 1, wherein a thickness of the $Al_{q1}In_{q2}Ga_{1-q1-q2}N$ ($0<q1, q2<1$) layer is in a range of 1 nm to 5 nm.

13. The light emitting device of claim 1, wherein a concentration (q2) of the indium in the $Al_{q1}In_{q2}Ga_{1-q1-q2}N$ ($0<q1, q2<1$) layer is in a range of 0.16 to 0.2.

14. The light emitting device of claim 1, wherein an energy band gap of the first $In_{p1}Ga_{1-p1}N$ ($0<p1<1$) layer is less than an energy band gap of the $Al_xIn_yGa_{(1-x-y)}N$ ($0\le x\le 1, 0\le y\le 1$) layer.

15. The light emitting device of claim 1, wherein a thickness of the $Al_{q1}In_{q2}Ga_{1-q1-q2}N$ ($0<q1, q2<1$) layer is less than a thickness of the first $In_{p1}Ga_{1-p1}N$ ($0<p1<1$) layer and the thickness of the $Al_{q1}In_{q2}Ga_{1-q1-q2}N$ ($0<q1, q2<1$) layer is less than a thickness of the second $In_{p2}Ga_{1-p2}N$ ($0<p2<1$) layer.

16. A lighting system comprising a light emitting unit including the light emitting device claimed in claim 1.

* * * * *